(12) United States Patent
Hsu et al.

(10) Patent No.: US 11,716,565 B2
(45) Date of Patent: Aug. 1, 2023

(54) SOUND EMITTING DEVICE USING LOUDSPEAKER TO DISSIPATE HEAT AND CONTROL METHOD THEREOF

(71) Applicant: Compal Electronics, Inc., Taipei (TW)

(72) Inventors: Chao-Kuei Hsu, Taipei (TW); Tzu-Yu Kao, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 3 days.

(21) Appl. No.: 17/518,881

(22) Filed: Nov. 4, 2021

(65) Prior Publication Data

US 2023/0086258 A1 Mar. 23, 2023

(30) Foreign Application Priority Data

Sep. 22, 2021 (TW) .................. 110135193

(51) Int. Cl.
*H04R 3/00* (2006.01)
*H04R 1/02* (2006.01)
*H03F 3/183* (2006.01)
*G01K 13/00* (2021.01)

(52) U.S. Cl.
CPC ............ *H04R 3/007* (2013.01); *H03F 3/183* (2013.01); *H04R 1/02* (2013.01); *G01K 13/00* (2013.01); *H03F 2200/03* (2013.01)

(58) Field of Classification Search
CPC ........ H04R 3/007; H04R 1/02; H04R 29/001; H04R 2499/11; G01K 13/00; H03F 3/183; H03F 2200/03; F04B 45/04; H05K 7/20136; H05K 7/20209; H05K 7/20972
See application file for complete search history.

(56) References Cited

U.S. PATENT DOCUMENTS

| 9,354,677 B2 | 5/2016 | Reilly et al. |
| 9,961,422 B2 | 5/2018 | Ting |
| 10,045,461 B1 | 8/2018 | Boozer et al. |
| 10,341,777 B2 | 7/2019 | Dong et al. |

(Continued)

FOREIGN PATENT DOCUMENTS

| CN | 104735949 A | 6/2015 |
| CN | 105430124 A | 3/2016 |

(Continued)

*Primary Examiner* — Jason R Kurr
(74) *Attorney, Agent, or Firm* — Kirton McConkie; Evan R. Witt (57) ABSTRACT

A sound emitting device includes a speaker box, a loudspeaker, a temperature sensor, a central processing unit and a signal amplifier. The speaker box includes a sound hole. The temperature sensor detects a temperature of the sound emitting device and generates a detection signal. The central processing unit pre-stores a default audio signal. When the central processing unit determines that the loudspeaker is in a standby state and the temperature of the sound emitting device exceeds a threshold value, the central processing unit issues the default audio signal. The signal amplifier is connected to and disposed between the central processing unit and the loudspeaker for amplifying the default audio signal and transmitting the amplified default audio signal to the loudspeaker. A vibration diaphragm of the loudspeaker undergoes a vibration action according to the amplified default audio signal.

12 Claims, 6 Drawing Sheets

(56) References Cited

U.S. PATENT DOCUMENTS

| | | | |
|---|---|---|---|
| 10,419,855 B2 | 9/2019 | Hare et al. | |
| 2010/0289998 A1* | 11/2010 | Pei | G02F 1/133385 |
| | | | 349/161 |
| 2015/0085441 A1* | 3/2015 | Reilly | H04R 29/001 |
| | | | 361/679.46 |
| 2015/0109732 A1* | 4/2015 | Akif | H05K 7/20136 |
| | | | 417/413.2 |
| 2015/0173237 A1* | 6/2015 | Lin | H05K 9/0026 |
| | | | 361/736 |
| 2021/0029426 A1* | 1/2021 | Huang | H04R 9/022 |

FOREIGN PATENT DOCUMENTS

| | | |
|---|---|---|
| CN | 104205870 B | 5/2018 |
| CN | 108616795 A | 10/2018 |
| CN | 104735949 B | 2/2019 |
| TW | I469651 B | 1/2015 |
| WO | 2019154359 A1 | 8/2019 |

* cited by examiner

SOUND EMITTING DEVICE USING LOUDSPEAKER TO DISSIPATE HEAT AND CONTROL METHOD THEREOF

FIELD OF THE INVENTION

The present invention relates to a sound emitting device, and more particularly to a sound emitting device using a loudspeaker to dissipate heat and a control method of the sound emitting device.

BACKGROUND OF THE INVENTION

Nowadays, sound emitting devices (also referred to as portable electronic devices) such as mobile phones are widely used. Due to the advancement of the cameras and the wireless communication speeds, the high-definition video recording operations, the applications of 3D mobile games and the 5G communication operations on the sound emitting devices become more popular. If the waste heat is not effectively removed during the operation, the performance of the sound emitting device is deteriorated. For enhancing the performance of the sound emitting device, it is necessary to increase the heat dissipation efficacy of the sound emitting device.

Generally, most of the existing sound emitting devices use passive heat dissipation mechanisms. For example, after the heat energy generated by a heat source is transferred to the external surface of the sound emitting device through a material with high thermal conductivity, the heat energy is transferred to the ambient air in a convection manner. Consequently, the temperature of the heat source can be decreased. However, due to the size limitation of the external surface of the sound emitting device, the rate of the heat energy to be dissipated by the passive heat dissipation mechanism is restricted. As the trend of designing the sound emitting device is toward miniaturization and high functionality, the efficacy of the passive heat dissipation mechanism cannot be largely enhanced. In other words, the efficacy of the passive heat dissipation mechanism is the design bottleneck of the sound emitting device.

For overcoming the drawbacks of the conventional technologies, there is a need of providing a sound emitting device using a loudspeaker to dissipate heat and a control method of the sound emitting device.

SUMMARY OF THE INVENTION

An object of the present invention is to provide a sound emitting device and a control method of the sound emitting device. The sound emitting device uses a loudspeaker to implement an active heat dissipation mechanism. Consequently, even if the size of the external surface of the sound emitting device is limited, the heat dissipation efficacy is enhanced.

In accordance with an aspect of the present invention, a sound emitting device is provided. The sound emitting device includes a speaker box, a loudspeaker, a temperature sensor, a central processing unit and a signal amplifier. The speaker box includes a sound hole. The loudspeaker is disposed within the speaker box. The temperature sensor detects a temperature of the sound emitting device and generates a detection signal. The central processing unit pre-stores a default audio signal therein and is configured to determine whether the temperature of the sound emitting device exceeds a threshold value according to the detection signal. When the central processing unit determines that the loudspeaker is in a standby state and the temperature of the sound emitting device exceeds the threshold value, the central processing unit issues the default audio signal. The default audio signal is a periodic signal. Each cycle of the default audio signal includes a positive half-cycle part and a negative half-cycle part. The signal amplifier is connected to and disposed between the central processing unit and the loudspeaker for amplifying the default audio signal and transmitting the amplified default audio signal to the loudspeaker.

In accordance with another aspect of the present invention, a control method of a sound emitting device is provided. The sound emitting device includes a speaker box, a loudspeaker, a temperature sensor, a central processing unit and a signal amplifier. The control method includes the following steps. Firstly, the temperature sensor detects a temperature of the sound emitting device and generates a detection signal. Then, the central processing unit determines whether the loudspeaker is in a standby state and determines whether the temperature of the sound emitting device exceeds a threshold value according to the detection signal. When the central processing unit determines that the loudspeaker is in the standby state and the temperature of the sound emitting device exceeds the threshold value, the central processing unit issues the default audio signal, wherein the default audio signal is a periodic signal, and each cycle of the default audio signal includes a positive half-cycle part and a negative half-cycle part. The signal amplifier amplifies the default audio signal and transmits the amplified default audio signal to the loudspeaker.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
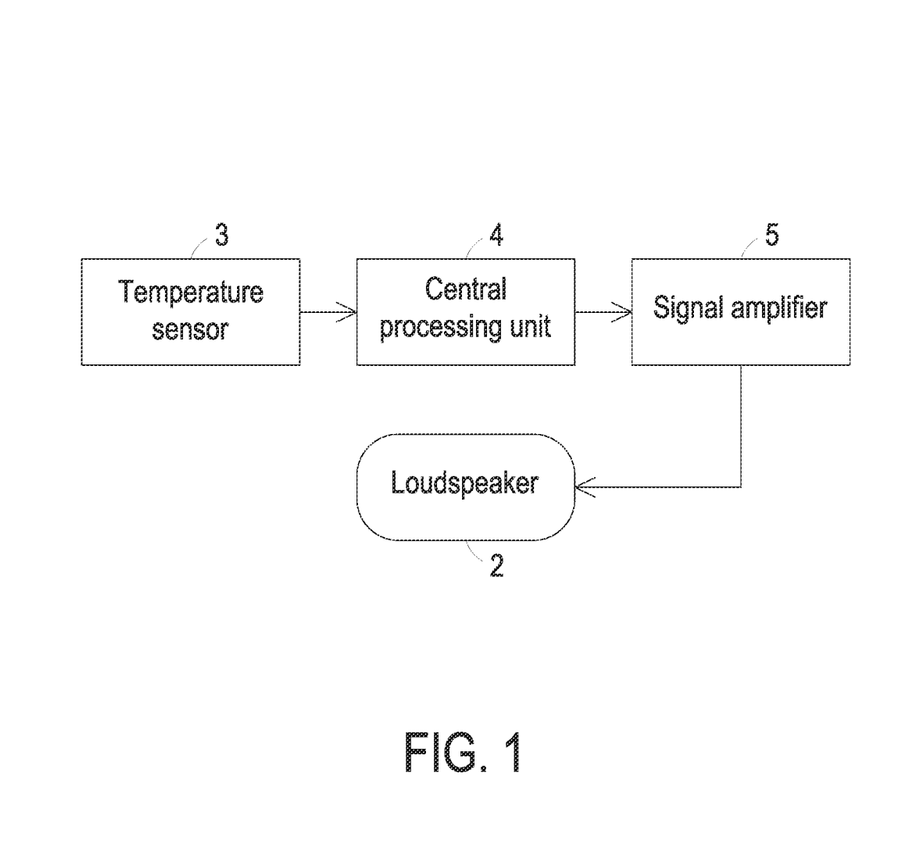
FIG. 1 is a schematic block diagram illustrating the architecture of a sound emitting device of the present invention.
Figure 2:
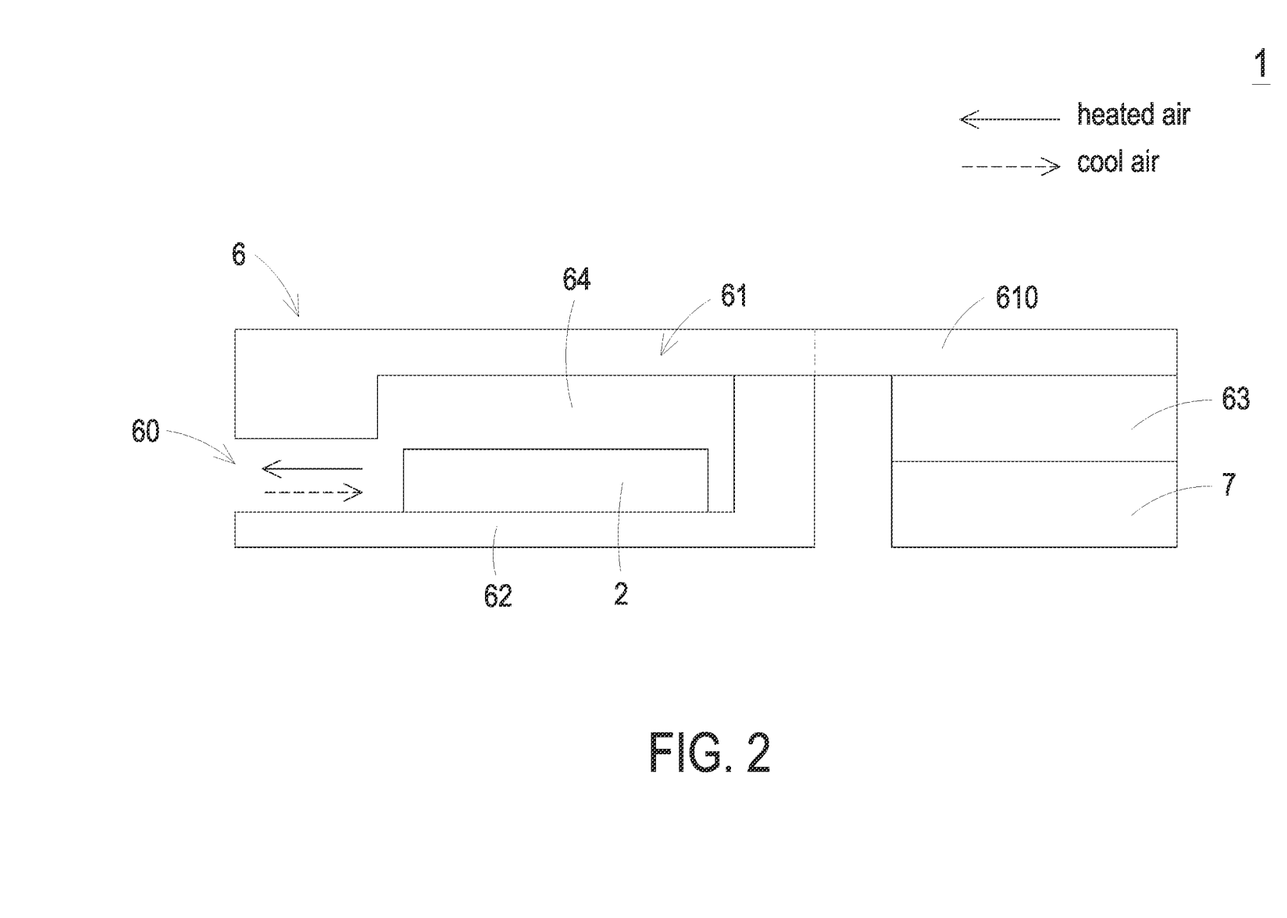
FIG. 2 is a schematic cross-sectional view illustrating a portion of the structure of a first exemplary sound emitting device of the present invention.
Figure 3:
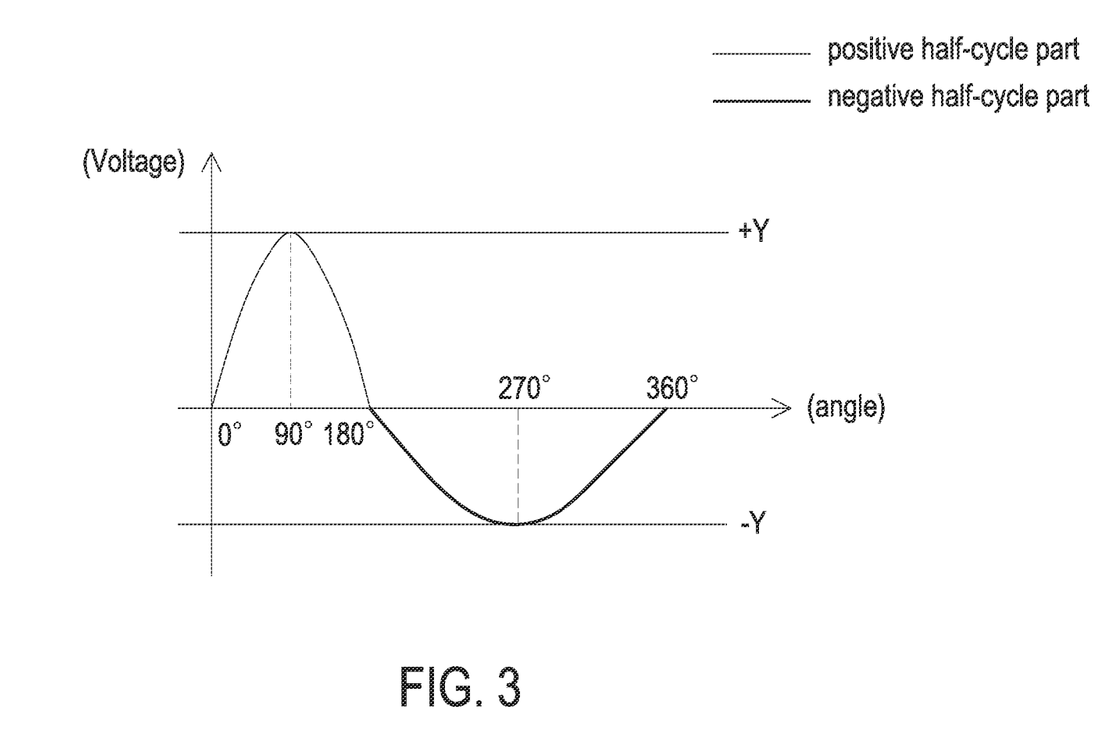
FIG. 3 is a schematic timing waveform diagram illustrating the amplified default audio signal from the signal amplifier in a time domain.
Figure 4:
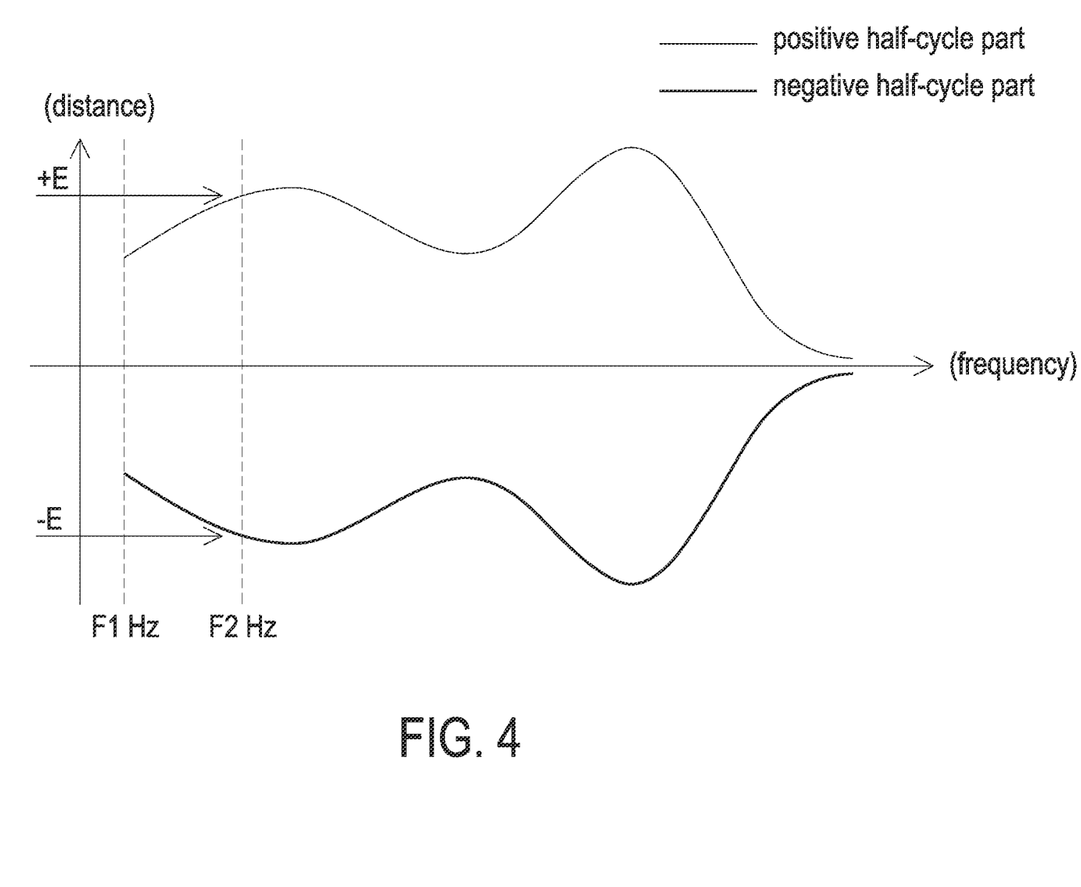
FIG. 4 is a relationship diagram illustrating the maximum excursion distance corresponding to each frequency of the amplified default audio signal from the signal amplifier received by the speaker of FIG. 1.

Please refer to FIGS. 1, 2, 3 and 4. FIG. 1 is a schematic block diagram illustrating the architecture of a sound emitting device of the present invention. FIG. 2 is a schematic cross-sectional view illustrating a portion of the structure of a first exemplary sound emitting device of the present invention. FIG. 3 is a schematic timing waveform diagram illustrating the amplified default audio signal from the signal amplifier in a time domain. FIG. 4 is a relationship diagram illustrating the maximum excursion distance corresponding to each frequency of the amplified default audio signal from the signal amplifier received by the speaker of FIG. 1. Preferably but not exclusively, the sound emitting device 1 is a portable electronic device such as a smart phone, a notebook computer, or any other appropriate portable electronic device. The sound emitting device 1 includes a loudspeaker 2, a temperature sensor 3, a central processing unit (CPU) 4, a signal amplifier 5 and a speaker box 6. The loudspeaker 2 is disposed within the speaker box 6. The speaker box 6 includes a sound hole 60. The loudspeaker 2 of the sound emitting device 1 can output a main audio signal that can be heard by human ears.

The temperature sensor 3 detects the temperature of the sound emitting device 1 and generates a detection signal. In an embodiment, the temperature sensor 3 is built in a host of the sound emitting device 1. In other embodiment, the loudspeaker 2, the central processing unit 4 the signal amplifier 5 and the speaker box 6 are also installed within the host. Alternatively, the temperature sensor 3 is an external circuit of the host, and the temperature sensor 3 and the host are individually disposed within the sound emitting device 1.

A default audio signal is pre-stored in the central processing unit 4. The central processing unit 4 receives the detection signal from the temperature sensor 3. According to the detection signal, the central processing unit 4 determines whether the temperature of the sound emitting device 1 exceeds a threshold value. In addition, the central processing unit 4 continuously determines whether the loudspeaker 2 is in a standby state. In the embodiment, the aforementioned standby state means that the loudspeaker 2 is not requested to output the main audio signal. If the central processing unit 4 determines that the loudspeaker 2 is in the standby state and the temperature of the sound emitting device 1 exceeds the threshold value, the default audio signal is outputted from the central processing unit 4.

The default audio signal is a periodic signal. In addition, each cycle of the default audio signal includes a positive half-cycle part (e.g., the waveform from 0 to 180 degrees in the time domain of FIG. 3) and a negative half-cycle part (e.g., the waveform from 180 to 360 degrees in the time domain of FIG. 3). The default audio signal is inaudible to human ear. The frequency of the default audio signal is below the lower limit of human audibility (e.g., 20 Hz). Whereas, if the central processing unit 4 determines that the loudspeaker 2 is not in the standby state or the temperature of the sound emitting device 1 does not exceed the threshold value, the central processing unit 4 stops outputting the default audio signal.

In an embodiment, the default audio signal is calculated and generated by a microcontroller unit (MCU) and/or a digital signal processor (DSP) (not shown), and the information about the default audio signal is pre-stored in the central processing unit 4, but it is not limited thereto. In other embodiment, the default audio signal is generated by a music editing software, and the information about the default audio signal is pre-stored in the central processing unit 4. Moreover, the waveform of the default audio signal may be a sine wave, a square wave, or any other appropriate wave. For illustration, the waveform of the default audio signal is a sine wave in the following examples. The sine wave is expressed as: $Y = A \sin \theta$, wherein Y is a voltage value of the sine wave, A is rated voltage received by the loudspeaker 2, and $\theta$ is an angle in the range between 0 and 360 degrees.

The signal amplifier 5 is connected to and disposed between the central processing unit 4 and the loudspeaker 2. After the default audio signal from the central processing unit 4 is amplified by the signal amplifier 5, the amplified default audio signal is transmitted to the loudspeaker 2. According to the amplified default audio signal, a vibration diaphragm (not shown) of the loudspeaker 2 generates corresponding vibration action. The waveform and characteristics of the amplified default audio signal from the signal amplifier 5 and the waveform and characteristics of the default audio signal from the central processing unit 4 substantially coincide with each other. In contrast, the amplitude of the amplified default audio signal is greater than the amplitude of the default audio signal.

The waveform of the amplified default audio signal in the time domain is shown in FIG. 3. The waveform of the amplified default audio signal in the frequency domain is shown in FIG. 4. As mentioned above, the default audio signal is a periodic signal, and each cycle of the default audio signal includes a positive half-cycle part and a negative half-cycle part. Similarly, as shown in FIGS. 3 and 4, the amplified default audio signal is a periodic signal, and each cycle of the amplified default audio signal includes a positive half-cycle part and a negative half-cycle part.

During the operation of the sound emitting device 1, a heat source 7 within the sound emitting device 1 generates heat energy and the air within the sound emitting device 1 is heated by the heat energy. In the positive half-cycle part of the default audio signal (or the amplified default audio signal), the vibration action of the vibration diaphragm of the loudspeaker 2 causes the heated air to be exhausted to the surroundings of the sound emitting device 1 through the sound hole 60. In the negative half-cycle part of the default audio signal (or the amplified default audio signal), the vibration action of the vibration diaphragm of the loudspeaker 2 causes the cool air to be inhaled into the sound emitting device 1 through the sound hole 60. In other words, if the central processing unit 4 determines that the loudspeaker 2 is in the standby state (i.e., the loudspeaker 2 is not requested to output the main audio signal) and the heat dissipation of the sound emitting device 1 is required, the loudspeaker 2 is operated to dissipate the heat energy according to the positive half-cycle part and the negative half-cycle part of the default audio signal (or the amplified default audio signal). In other words, the active heat dissipation mechanism is implemented when the user cannot hear the sound from the sound emitting device 1. Even if the size of the external surface of the sound emitting device 1 is limited, the heat dissipation efficacy is enhanced.

In an embodiment, the vibration direction of the vibration diaphragm of the loudspeaker 2 is substantially in parallel with the direction of the airflow passing through the sound hole 60. In the positive half-cycle part of the default audio signal (or the amplified default audio signal), the vibration diaphragm of the loudspeaker 2 is vibrated in the direction close to the sound hole 60, and thus the heated air is exhausted to the surroundings of the sound emitting device 1 through the sound hole 60. In the negative half-cycle part of the default audio signal (or the amplified default audio signal), the vibration diaphragm of the loudspeaker 2 is vibrated in the direction away from the sound hole 60, and thus the cool air is inhaled into the sound emitting device 1 through the sound hole 60.

Especially, the positive half-cycle part and the negative half-cycle part of the default audio signal (or the amplified default audio signal) are adjustable. For example, in an embodiment, the time length of the positive half-cycle part is shorter than the time length of the negative half-cycle part. That is, the frequency of the default audio signal (or the amplified default audio signal) in the positive half-cycle part is higher than the frequency of the default audio signal (or the amplified default audio signal) in the negative half-cycle part. Since the vibration diaphragm of the loudspeaker 2 is vibrated in a fast-push and slow-pull manner, the heated air is exhausted to the surroundings at a high frequency and the cool air is inhaled into the sound emitting device 1 at a slow frequency (i.e., at the large amount). Consequently, the heat dissipation efficacy of the sound emitting device 1 is increased.

Please refer to FIGS. 3 and 4 again. When the angles in the time domain are 90 and 270 degrees, the vibration diaphragm of the loudspeaker 2 has the maximum excursion distances of the positive voltage and the negative voltage. As shown in FIG. 4, it can be seen that the maximum excursion distances at different frequencies are different according to the characteristics of the diaphragm material. In the negative half-cycle part of the default audio signal (or the amplified default audio signal), the excursion distance of the vibration diaphragm of the loudspeaker 2 at the frequency F1 Hz is less than the excursion distance of the vibration diaphragm at the frequency F2 Hz. The vibration diaphragm of the loudspeaker 2 vibrates slowly, so that the amount of the cool air inhaled into the sound emitting device 1 through the sound hole 60 is stilled increased. In other words, in the positive half-cycle part of the default audio signal (or the amplified default audio signal), the excursion distance of the vibration diaphragm of the loudspeaker 2 at the frequency F2 Hz is greater than the excursion distance of the vibration diaphragm at the frequency F1 Hz. The vibration diaphragm of the loudspeaker 2 vibrates rapidly, so that the heated air in the speaker box 6 can be exhausted to the surroundings of the sound emitting device 1 through the sound hole 60 rapidly. In FIG. 4, the label E is the maximum excursion distance of the diaphragm of the loudspeaker 2 as the default audio signal is at the frequency F2 Hz.

Please refer to FIG. 2 again. In an embodiment, the sound emitting device 1 includes a first housing 61, a second housing 62 and a first thermal conduction medium 63. The first housing 61 is made of metallic thermal conductive material, e.g., copper or aluminum. The second housing 62 is made of plastic material. The first housing 61 and the second housing 62 are combined together, so that the speaker box 6 with a chamber 64 is defined. Moreover, a part of the first housing 61 and a part of the second housing 62 are separated from each other, so that the sound hole 60 of the speaker box 6 is formed. The first housing 61 further includes an extension part 610. The extension part 610 is protruded from an external surface of the speaker box 6. The loudspeaker 2 is disposed within the chamber 64 and disposed on the second housing 62. The first thermal conduction medium 63 is disposed between the heat source 7 and the extension part 610 of the first housing 61. Moreover, the first thermal conduction medium 63 is contacted with the heat source 7 and the extension part 610 of the first housing 61. Preferably but not exclusively, the first thermal conduction medium 63 is made of thermal paste, thermal pad or solder paste. As shown in FIG. 2, the heat energy generated by the heat source 7 is transferred to the speaker box 6 through the first thermal conduction medium 63 and the first housing 61. Consequently, the air within the speaker box 6 is heated by the heat energy. In the positive half-cycle part of the default audio signal (or the amplified default audio signal), the vibration action of the vibration diaphragm of the loudspeaker 2 causes the heated air to be exhausted to the surroundings of the sound emitting device 1 through the sound hole 60. In the negative half-cycle part of the default audio signal (or the amplified default audio signal), the vibration action of the vibration diaphragm of the loudspeaker 2 causes the cool air to be inhaled into the sound emitting device 1 through the sound hole 60. Consequently, the heat dissipation efficacy is enhanced.

Figure 5:
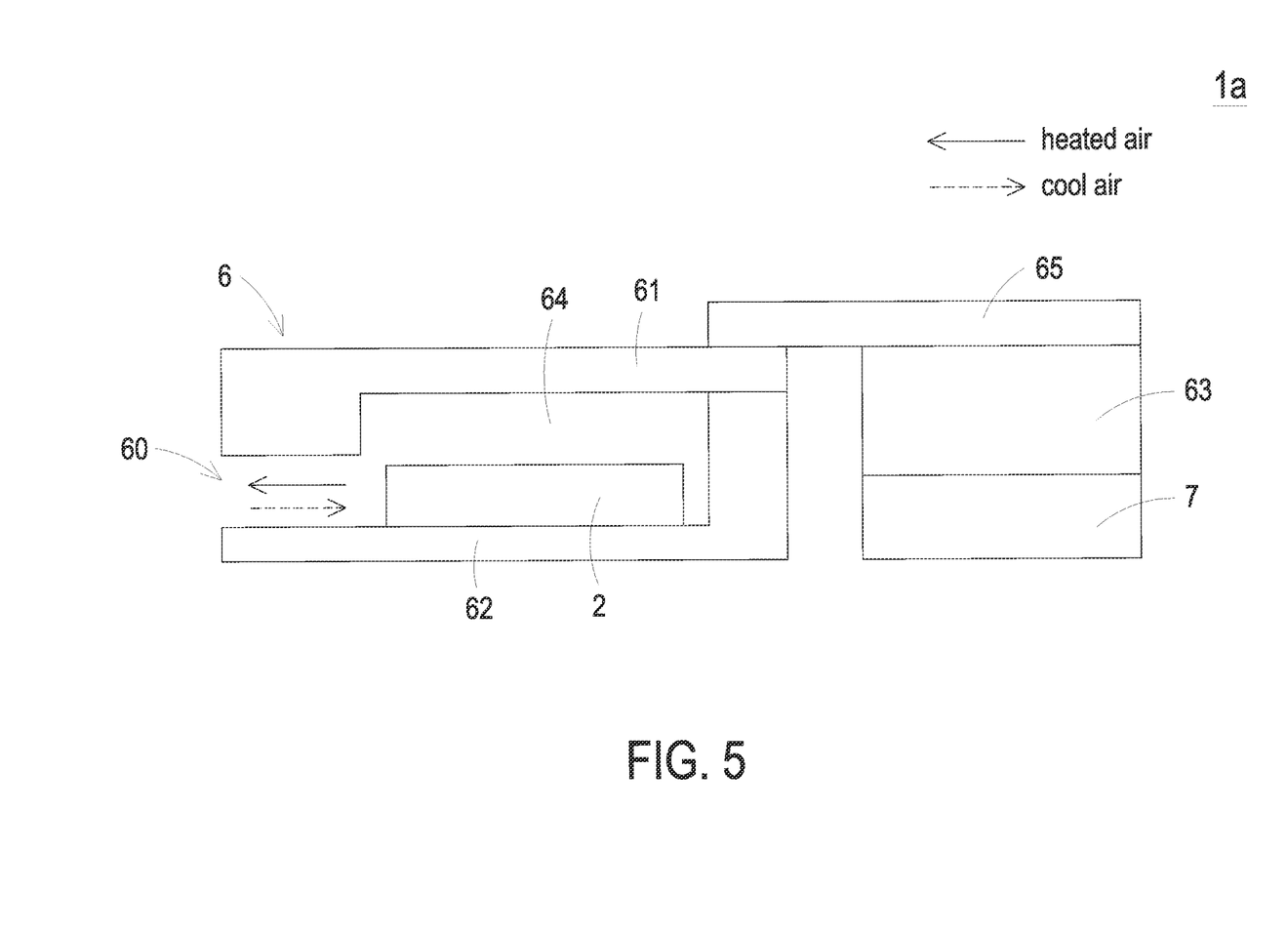
FIG. 5 is a schematic cross-sectional view illustrating a portion of the structure of a second exemplary sound emitting device of the present invention.

FIG. 5 is a schematic cross-sectional view illustrating a portion of the structure of a second exemplary sound emitting device of the present invention. Component parts and elements corresponding to those of the first exemplary sound emitting device 1 of FIGS. 1 and 2 are designated by identical numeral references, and detailed descriptions thereof are omitted. Similarly, the sound emitting device 1a also includes the first housing 61, the second housing 62 and the first thermal conduction medium 63. In comparison with the first exemplary sound emitting device 1, the sound emitting device 1a further includes a second thermal conduction medium 65, and the first housing 61 of the sound emitting device 1a omits the extension part 610. The first thermal conduction medium 63 is contacted with the heat source 7, but not contacted with the first housing 61. The second thermal conduction medium 65 is disposed between the first thermal conduction medium 63 and the first housing 61. In addition, the second thermal conduction medium 65 is contacted with the first thermal conduction medium 63 and the first housing 61. Preferably but not exclusively, each of the first thermal conduction medium 63 and the second thermal conduction medium 65 is made of thermal paste, thermal pad or solder paste. More preferably, the first thermal conduction medium 63 and the second thermal conduction medium 65 are made of different heat conduction materials. As shown in FIG. 5, the heat energy generated by the heat source 7 is transferred to the speaker box 6 through the first thermal conduction medium 63, the second thermal conduction medium 65 and the first housing 61 sequentially. Consequently, the air within the speaker box 6 is heated by the heat energy. In the positive half-cycle part of the default audio signal (or the amplified default audio signal), the vibration action of the vibration diaphragm of the loudspeaker 2 causes the heated air to be exhausted to the surroundings of the sound emitting device 1a through the sound hole 60. In the negative half-cycle part of the default audio signal (or the amplified default audio signal), the vibration action of the vibration diaphragm of the loudspeaker 2 causes the cool air to be inhaled into the sound emitting device 1a through the sound hole 60. Consequently, the heat dissipation efficacy is enhanced.

In some embodiments, a plurality of fins (not shown) are formed on an external surface of the first housing 61. Due to the fins, the heat dissipation area of the sound emitting device is increased. Consequently, the heat dissipation efficacy is further enhanced.

Figure 6:
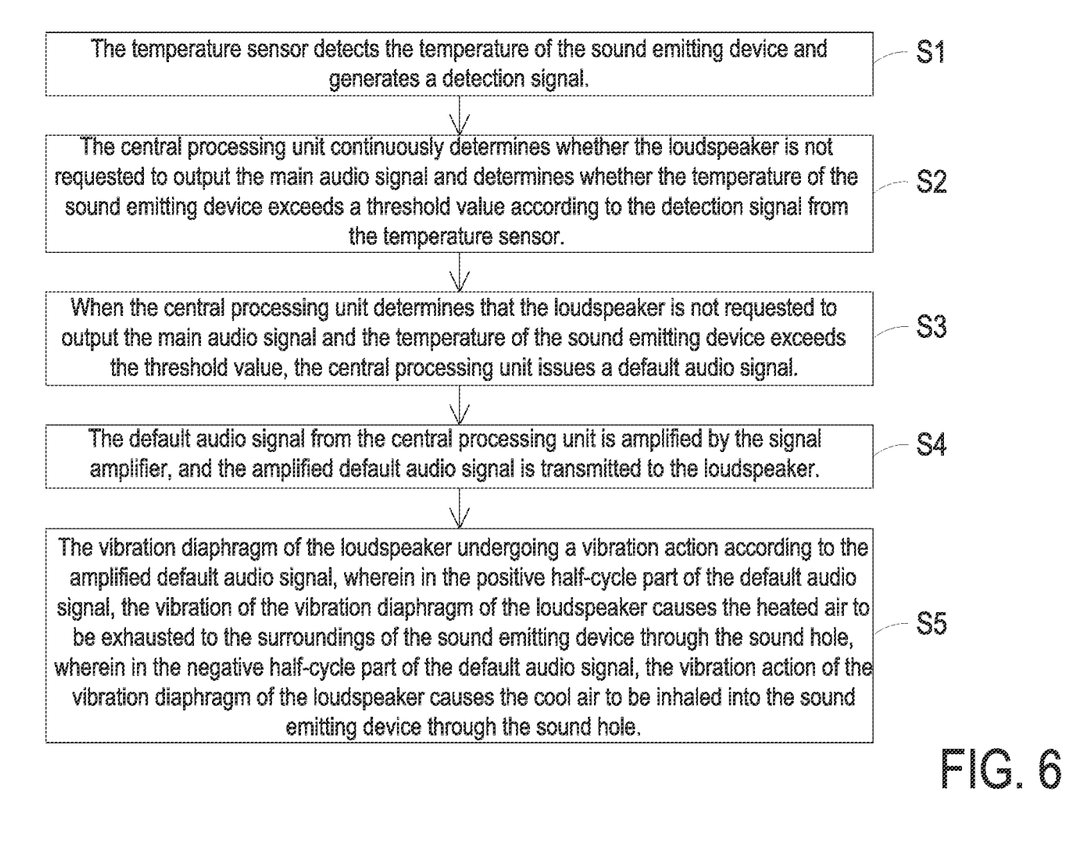
FIG. 6 is a flowchart of a control method of the sound emitting device according to an embodiment of the present invention.

FIG. 6 is a flowchart of a control method of the sound emitting device according to an embodiment of the present invention. The control method is applied to the sound emitting device as shown in FIGS. 1, 2, 3 and 4. The control method includes the following steps.

In a step S1, the temperature sensor 3 detects the temperature of the sound emitting device 1 and generates a detection signal.

In a step S2, the central processing unit 4 continuously determines whether the loudspeaker 2 is in a standby state (i.e., the loudspeaker 2 is not requested to output the main audio signal), and the central processing unit 4 determines whether the temperature of the sound emitting device 1 exceeds a threshold value according to the detection signal from the temperature sensor 3.

If the central processing unit 4 determines that the loudspeaker 2 is in the standby state and the temperature of the sound emitting device 1 exceeds the threshold value, the central processing unit 4 issues a default audio signal (Step S3).

In a step S4, the default audio signal from the central processing unit 4 is amplified by the signal amplifier 5, and the amplified default audio signal is transmitted to the loudspeaker 2.

In a step S5, the vibration diaphragm of the loudspeaker 2 undergoes a vibration action according to the amplified default audio signal. In the positive half-cycle part of the default audio signal, the vibration of the vibration diaphragm of the loudspeaker 2 causes the heated air to be exhausted to the surroundings of the sound emitting device 1 through the sound hole 60. In the negative half-cycle part of the default audio signal, the vibration action of the vibration diaphragm of the loudspeaker 2 causes the cool air to be inhaled into the sound emitting device 1 through the sound hole 60. Certainly, in some embodiments, after the step S5 is performed, the steps S1 to S5 are repeatedly done.

From the above descriptions, the present invention provides a sound emitting device and a control method of the sound emitting device. If the central processing unit determines that the loudspeaker is in the standby state (i.e., the loudspeaker is not requested to output the main audio signal) and the heat dissipation of the sound emitting device is required, the loudspeaker is operated to dissipate the heat energy according to the positive half-cycle part and the negative half-cycle part of the default audio signal (or the amplified default audio signal). In other words, the active heat dissipation mechanism is implemented when the user cannot hear the sound from the sound emitting device. Even if the size of the external surface of the sound emitting device is limited, the heat dissipation efficacy is enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A sound emitting device, comprising:
   a speaker box comprising a sound hole;
   a loudspeaker disposed within the speaker box;
   a temperature sensor for detecting a temperature of the sound emitting device and generating a detection signal;
   a central processing unit pre-storing a default audio signal therein and configured to determine whether a temperature of the sound emitting device exceeds a threshold value according to the detection signal, wherein when the central processing unit determines that the loudspeaker is in a standby state and the temperature of the sound emitting device exceeds the threshold value, the central processing unit issues the default audio signal, wherein the default audio signal is a periodic signal, and each cycle of the default audio signal comprises a positive half-cycle part and a negative half-cycle part; and
   a signal amplifier connected to and disposed between the central processing unit and the loudspeaker for amplifying the default audio signal and transmitting the amplified default audio signal to the loudspeaker;
   wherein a frequency of the default audio signal in the positive half-cycle part is higher than a frequency of the default audio signal in the negative half-cycle part.

2. The sound emitting device according to claim 1, wherein a vibration diaphragm of the loudspeaker undergoes a vibration action according to the amplified default audio signal, wherein in the positive half-cycle part of the default audio signal, the vibration of the vibration diaphragm of the loudspeaker causes heated air to be exhausted to surroundings of the sound emitting device through the sound hole, wherein in the negative half-cycle part of the default audio signal, the vibration action of the vibration diaphragm of the loudspeaker causes cool air to be inhaled into the sound emitting device through the sound hole.

3. The sound emitting device according to claim 1, wherein the default audio signal is inaudible to human ear.

4. The sound emitting device according to claim 1, wherein the default audio signal is a sine wave signal.

5. The sound emitting device according to claim 1, wherein in the positive half-cycle part of the default audio signal, the vibration diaphragm of the loudspeaker is vibrated in a direction close to the sound hole, wherein in the negative half-cycle part of the default audio signal, the vibration diaphragm of the loudspeaker is vibrated in a direction away from the sound hole.

6. The sound emitting device according to claim 1, wherein the sound emitting device comprises a first housing, a second housing and a first thermal conduction medium, wherein the first housing is made of metallic thermal conductive material, the second housing is made of plastic material, and the first housing and the second housing are combined together to define the speaker box, wherein the first housing further comprises an extension part, and the extension part is protruded from an external surface of the speaker box, wherein the first thermal conduction medium is disposed between a heat source and the extension part of the first housing, and the heat source is contacted with the extension part of the first housing.

7. The sound emitting device according to claim 1, wherein the sound emitting device comprises a first housing, a second housing, a first thermal conduction medium and a second thermal conduction medium, wherein the first housing is made of metallic thermal conductive material, the second housing is made of plastic material, and the first housing and the second housing are combined together to define the speaker box, wherein the first thermal conduction medium is contacted with a heat source, the second thermal conduction medium is disposed between the first thermal conduction medium and a part of the first housing, and the second thermal conduction medium is contacted with the first thermal conduction medium and the first housing.

8. The sound emitting device according to claim 7, wherein the first thermal conduction medium and the second thermal conduction medium are made of different heat conduction materials.

9. A control method of a sound emitting device, the sound emitting device comprising a speaker box, a loudspeaker, a temperature sensor, a central processing unit and a signal amplifier, the control method comprising steps of:

the temperature sensor detecting a temperature of the sound emitting device and generating a detection signal;

the central processing unit continuously determining whether the loudspeaker is in a standby state and determining whether a temperature of the sound emitting device exceeds a threshold value according to the detection signal;

when the central processing unit determines that the loudspeaker is in the standby state and the temperature of the sound emitting device exceeds the threshold value, the central processing unit issuing the default audio signal, wherein the default audio signal is a periodic signal, and each cycle of the default audio signal comprises a positive half-cycle part and a negative half-cycle part; and the signal amplifier amplifying the default audio signal, and transmitting the amplified default audio signal to the loudspeaker;

wherein a frequency of the default audio signal in the positive half-cycle part is higher than a frequency of the default audio signal in the negative half-cycle part.

10. The control method according to claim 9, wherein a vibration diaphragm of the loudspeaker undergoing a vibration action according to the amplified default audio signal, wherein in the positive half-cycle part of the default audio signal, the vibration of the vibration diaphragm of the loudspeaker causes heated air to be exhausted to surroundings of the sound emitting device through a sound hole of the speaker box, wherein in the negative half-cycle part of the default audio signal, the vibration action of the vibration diaphragm of the loudspeaker causes cool air to be inhaled into the sound emitting device through the sound hole.

11. The control method according to claim 9, wherein the default audio signal is inaudible to human ear.

12. The control method according to claim 9, wherein the default audio signal is a sine wave signal.

* * * * *